United States Patent [19]

Yu

[11] Patent Number: 5,728,622
[45] Date of Patent: Mar. 17, 1998

[54] PROCESS FOR FORMING FIELD OXIDE LAYERS IN SEMICONDUCTOR DEVICES

[75] Inventor: Tzu-Chiang Yu, Yungkang, Taiwan

[73] Assignee: Winbond Electronics Corporation, Taiwan

[21] Appl. No.: 617,029

[22] Filed: Mar. 18, 1996

[51] Int. Cl.[6] .................................................. H01L 21/76
[52] U.S. Cl. .................................................. 438/443; 438/452
[58] Field of Search .................... 437/69, 70; 156/636.1; 148/DIG. 85, DIG. 86, DIG. 117; 438/443, 452

[56] References Cited

U.S. PATENT DOCUMENTS

| | | | |
|---|---|---|---|
| 4,721,687 | 1/1988 | Kakumu et al. | 437/69 |
| 5,393,694 | 2/1995 | Mathews | 437/72 |
| 5,567,645 | 10/1996 | Ahn et al. | |

FOREIGN PATENT DOCUMENTS 4-150030  5/1992  Japan .

Primary Examiner—George R. Fourson
Attorney, Agent, or Firm—Rabin, Champagne, & Lynt, P.C.

[57] ABSTRACT

A process for forming a narrow field oxide layer with a greater thickness. A silicon substrate is provided on which a layer of pad oxide and a layer of nitride are formed. Then, at least a wide area and a narrow area are defined on the silicon substrate through openings on the nitride layer. A thermal oxidation process is performed so as to grow a first oxide layer on the wide area and a second oxide layer on the narrow area. A polysilicon layer is then deposited over the entire surface. After that, chemical-mechanical polish (CMP) is applied so as to rub away part of the polysilicon layer that is lying above a plane coincident with the topmost surface of the nitride layer, thereby leaving a first polysilicon layer on the first oxide layer and a second polysilicon layer on the second oxide layer. A thermal oxidation process is performed so as to oxidize the first polysilicon layer and the second polysilicon layer, thereby increasing the thickness of the first oxide layer and the second oxide layer. The resultant thickness of the oxide layer formed on the narrow area is approximately equal to that of the oxide layer formed on the wide area.

14 Claims, 2 Drawing Sheets

5,728,622

PROCESS FOR FORMING FIELD OXIDE LAYERS IN SEMICONDUCTOR DEVICES

BACKGROUND OF THE INVENTION

1. Field of the Invention

The invention relates to processes for forming field oxide layers in semiconductor devices, and more particularly, to a process for forming field oxide layers of various widths with approximately equal thickness.

2. Description of Related Art

Present semiconductor fabrication technology has advanced to the point at which the integration of several millions of semiconductor devices on a chip of just a few square millimeters in size is possible. For such a high density of integration on the chip, a technology commonly referred to as device isolation technology (DIT) is used to build adequate insulation or isolation between individual devices, so as to allow each device to perform normally without being influenced by adjacent devices. Moreover, DIT technology has the goal of reducing the chip area used to build the insulation or isolation, such that more of the total chip area can be used as active regions for more integration of devices.

Conventionally, semiconductor fabrication utilizes the local oxidation of silicon (LOCOS) method for device isolation, in which thick oxide layers are formed to serve as insulating layers between individual devices. In this method, silicon nitride is used to form a mask during oxidation since its oxidation rate is far less than that of the silicon substrate. After the thick oxide layers are formed, active regions between each pair of neighboring field oxide layers are used to form individual devices on the wafer.

When utilized in submicron IC fabrication, however, the LOCOS method has several drawbacks. First, since the oxidation of the silicon is isotropic, meaning that the oxidation occurs in all directions, the field oxide would extend beneath the silicon nitride layer, thus raising the silicon nitride layer to cause a so-called bird's beak effect.

Second, due to pressure from the beak-like portion of the field oxide on the silicon nitride layer, the nitrogen ingredient in the compressive stress region on the silicon nitride layer would diffuse to the tensile stress region at the junction between the underlying pad oxide layer and the silicon substrate, thereby forming silicon nitride on the silicon substrate. The thus formed silicon nitride has the adverse effect of acting as a mask during growth of the gate oxide layer in subsequent steps, thus causing the gate oxide to be grown only to a thin layer. This effect is commonly referred to as the "white ribbon" effect since a white ribbon area would appear on the rim of the active regions, which is visible to the eye when viewed with a microscope.

Third, since the rate of flow of oxygen through openings on the mask is proportional to the dimensions of the openings, a field oxide layer grown through a narrow opening would be thinner than that grown through a wide opening. The diminished thickness of the field oxide layer on a narrow area would substantially affect its isolation capacity.

For example, in CMOS fabrication, field oxide layers are grown on areas defined by openings in the mask. A wide opening defines a wide growth area and a narrow opening defines a narrow growth area. Since the rate of flow of oxygen through openings in the mask is proportional to the dimensions of the openings, a field oxide layer grown through the narrow opening on the narrow area would be grown to a lesser thickness than that grown through the wide opening on the wide area. The diminished thickness of the field oxide layer could cause such adverse effects as leakage current due to punch-through and inversion of FET devices, which would substantially affect the performance and reliability of the CMOS devices. These adverse effects would be even worse if poly gates serving as word lines on a memory device are formed over the field oxide layer.

To solve the foregoing problem, there exists a need for a method of forming a field oxide layer that can increase the thickness of field oxide layers formed on narrow areas and maintain the concentration of impurities around the well of each field oxide layer to be substantially equal.

SUMMARY OF THE INVENTION

It is therefore an object of the invention to provide a process for forming a field oxide layer on a narrow area with a somewhat thicker oxide layer, so as to prevent the adverse effects of leakage current due to punch-through and inversion of FET devices.

In accordance with the foregoing and other objects of the invention, a new and improved process for forming field oxide layers is provided. The process comprises the steps of: (1) preparing a silicon substrate on which a layer of pad oxide and a layer of nitride are successively formed, and then forming through the nitride layer a first opening of a first width and a second opening of a second width less than the first width so as to define a wide area and a narrow area on the silicon substrate; (2) performing a thermal oxidation process so as to grow a first oxide layer on the wide area and a second oxide layer on the narrow area; (3) depositing a polysilicon layer on the nitride layer, the first oxide layer and the second oxide layer; (4) performing a chemical-mechanical polish (CMP) process on the wafer so as to rub away part of the polysilicon layer that is lying above a plane coincident with the topmost surface of the nitride layer which surface acts to stop the CMP process, thereby leaving a first polysilicon layer on the first oxide layer and a second polysilicon layer on the second oxide layer, the first polysilicon layer being less in thickness than the second polysilicon layer; and (5) performing a thermal oxidation process so as to oxidize the first polysilicon layer and the second polysilicon layer, thereby increasing the thickness of the first oxide layer and the second oxide layer.

BRIEF DESCRIPTION OF DRAWINGS

The invention can be more fully understood from the following detailed description of the preferred embodiment with reference to the accompanying drawings, wherein.

DETAILED DESCRIPTION OF PREFERRED EMBODIMENT

Referring to FIGS. 1–7, there are shown schematic sectional diagrams depicting the steps involved in the process according to the invention for forming a narrow field oxide layer with a greater thickness.

Figure 1:
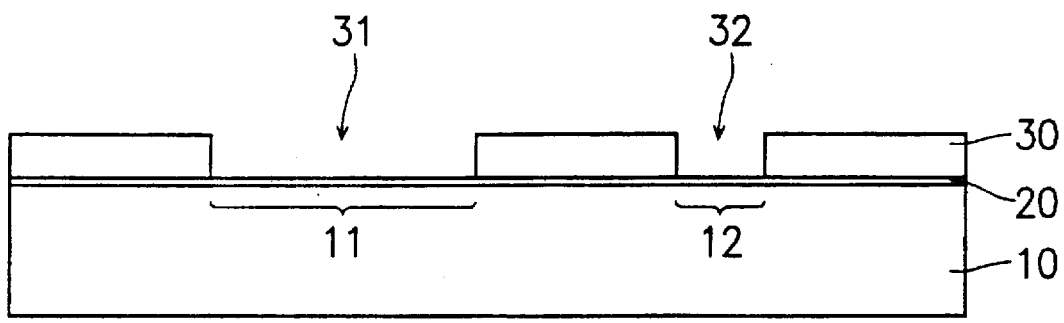
FIGS. 1–7 are schematic sectional views depicting the steps involved in the process according to the invention for forming a narrow field oxide layer with a greater thickness.

As shown in FIG. 1, a silicon substrate 10 is prepared. A layer of pad oxide 20 is then formed over the silicon substrate 10 by thermal oxidation to a thickness of about 150 Å to 250 Å, and a layer of nitride 30 is formed over the pad oxide 20 by the low-pressure chemical-vapor deposition (LPCVD) technique to a thickness of about 1,500 Å to 2,000

Å. Further, a first opening 31 of a broad width and a second opening 32 of a narrow width are formed through the nitride layer 30 by a lithographic process and plasma etching, so as to define a wide area 11 and a narrow area 12 respectively, on the silicon substrate 10. These two areas 11, 12 receive oxide layers thereon. The ratio of the thickness of the nitride layer 30 to that of the pad oxide 20 is controlled to be in the range from about 8 to 10, and the total thickness of the pad oxide 20 plus the nitride layer 30 is controlled to be about 0.4 to 0.6 times the thickness of the field oxide layers that are to be formed later through the openings 31, 32. The provision of the pad oxide 20 between the silicon substrate 10 and the nitride layer 30 prevents the formation of defects in the wafer (the assembly shown in FIG. 1), since there is a great difference between the thermal expansion coefficient of the nitride layer 30 and that of the silicon substrate 10.

Furthermore, ions such as boron ions optimally can be implanted through the openings 31, 32 onto the silicon substrate 10, so as to increase the concentration of impurities. This would have the effect of raising the offset voltage of the field oxide layers that are to be formed later, so as to increase the isolation capacity thereof.

Figure 2:
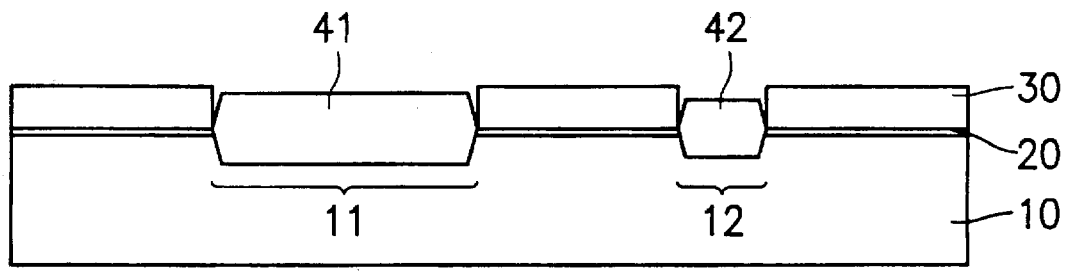

Referring next to FIG. 2, in a subsequent step the wafer is placed in an oven (not shown) for thermal oxidation at a temperature of about 950° C. to 1,050° C., so as to grow a first oxide layer 41 on the wide area 11 of the silicon substrate 10 and a second oxide layer 42 on the narrow area 12 of the same. The two oxide layers 41, 42 are each grown to a thickness of about 3,500 Å to 4,500 Å, but since the rate of flow of oxygen is larger through the wide opening 31 than that through the narrow opening 32, the first oxide layer 41 is thicker than the second oxide layer 42, as illustrated in FIG. 2.

Figure 3:
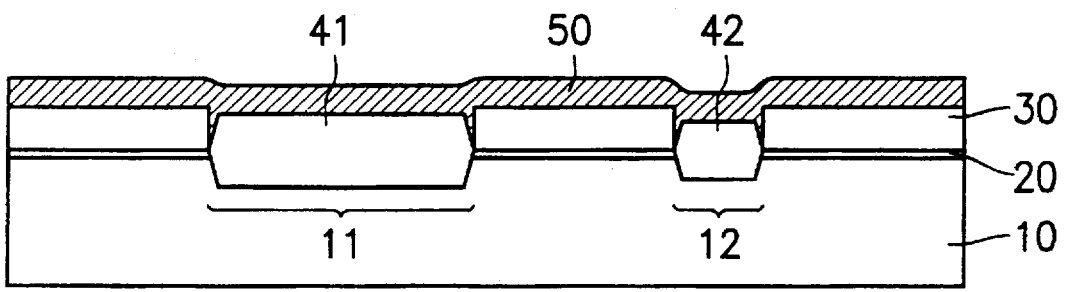

Referring next to FIG. 3, in a next step a polysilicon layer 50 is deposited also by the LPCVD method to a thickness of about 2,000 Å to 3,000 Å, over the entire wafer. The polysilicon layer 50 thus covers the nitride layer 30, the first oxide layer 41 and the second oxide layer 42.

Figure 4:
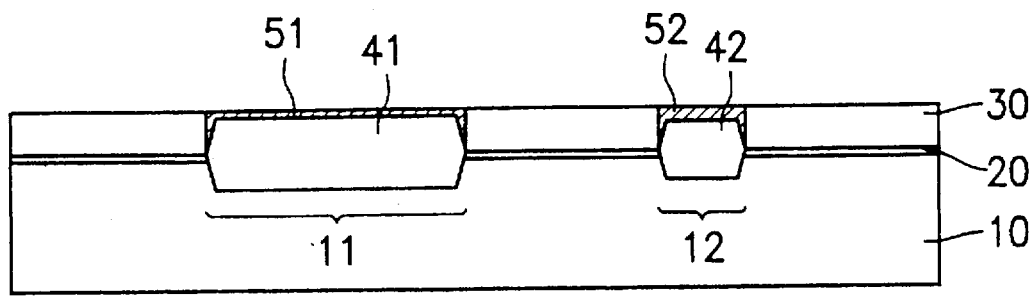

Referring next to FIG. 4, chemical-mechanical polish (CMP) is then applied to the wafer so as to rub away part of the polysilicon layer 50 that lies above the plane coincident with the topmost surface of the nitride layer 30, which surface acts as a stopper to the polish. As a result, a thin polysilicon layer 51 is left on the first oxide layer 41 and a thick polysilicon layer 52 is left on the second oxide layer 42. Since the first oxide layer 41 is grown to a greater thickness than the second oxide layer 42, the thin polysilicon layer 51 is thinner than the thick polysilicon layer 52.

Figure 5:
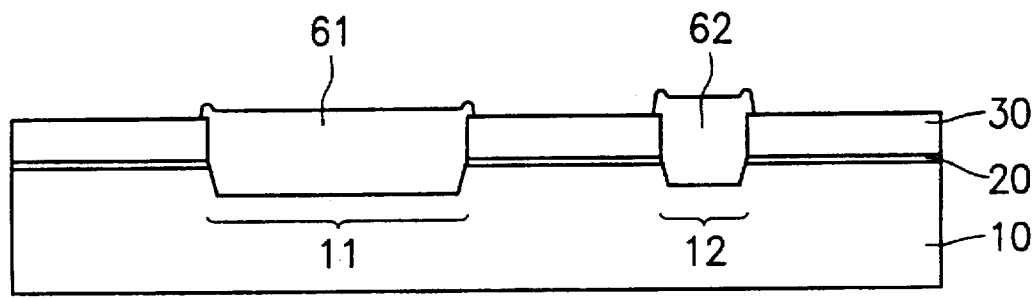

Referring next to FIG. 5, in the subsequent step thermal oxidation is performed again on the wafer, at a temperature of about 950° C. to 1,050° C., so as to oxidize the thin polysilicon layer 51 on the first oxide layer 41 and the thick polysilicon layer 52 on the second oxide layer 42, thereby increasing the thickness of the two oxide layers (hereinafter referred to also as first oxide layer and second oxide layer, but labeled respectively with the numerals 61 and 62 so as to distinguish them from their predecessors, i.e., 41, 42). Since the thick polysilicon layer 52 is thicker than the thin polysilicon layer 51, the additional thickness contributed by the thick polysilicon layer 52 to the second oxide layer 62 is greater than that contributed by the thin polysilicon layer 51 to the first oxide layer 61, thereby allowing the height of the second oxide layer 62 relative to the upper surface of the nitride layer 30, to be greater than that of the first oxide layer 61. It is apparent from the step of FIG. 5, however, that the process according to the invention allows the narrow oxide layer to be formed with a thickness approximately equal to that of the wide oxide layer.

Figure 6:
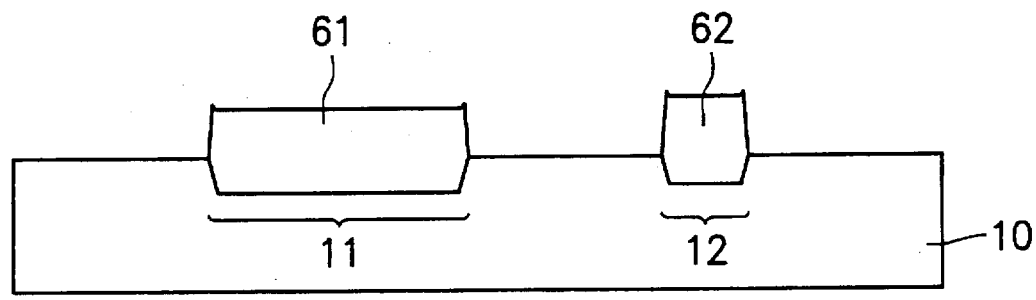

Referring next to FIG. 6, an isotropic etching process is next performed by applying hydrofluoric acid to the first oxide layer 61 and the second oxide layer 62, and then $H_3PO_4$ and hydrofluoric acid are used to etch away the nitride layer 30 and pad oxide 20. The resultant structure of the wafer is illustrated in FIG. 6.

Figure 7:
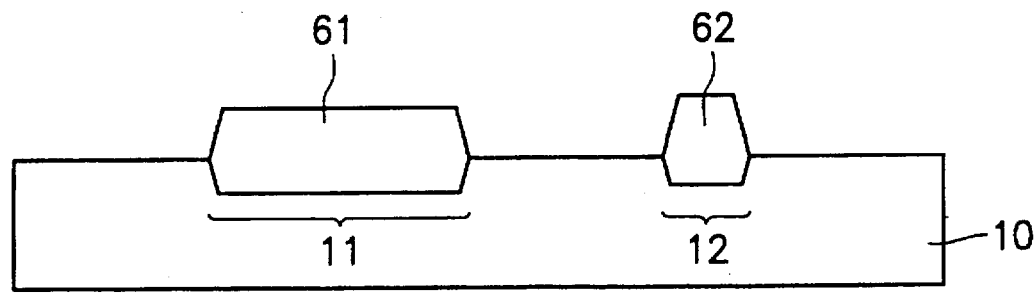

Referring to FIG. 7, thermal oxidation is then performed on the wafer to form a sacrificial oxide layer. Then hydrofluoric acid is used to etch the oxide layers to specific thicknesses as would prevent the possible occurrence of the white ribbon effect.

It can be clearly seen from FIG. 7 that, using the process according to the invention, the second oxide layer 62 formed on the narrow area 12 on the silicon substrate 10 is somewhat greater in height relative to the upper surface of the nitride layer 30, than the first oxide layer 61 formed on the wide area 11, thereby allowing the thickness of the second oxide layer 62 to be approximately equal to that of the first oxide layer 61. It is also apparent that the invention provides the ability to form oxide layers on narrow regions on the silicon substrate with a greater thickness for increased isolation capacity.

The invention has been described above with an exemplary preferred embodiment. However, it is to be understood that the scope of the invention is not limited to the disclosed embodiment. To the contrary, various modifications and similar arrangements are also contemplated and these will be apparent to those skilled in the art. The invention is intended to cover such modifications and similar arrangements. The scope of the claims therefore should be accorded the broadest interpretation so as to encompass all such modifications and similar arrangements.

What is claimed is:

1. A process for forming at least a first field oxide layer and a second field oxide layer of different widths with approximately equal thickness, comprising:

(1) providing a silicon substrate on which a layer of pad oxide and a layer of nitride are successively formed and then forming through the nitride layer a wide area first opening of a first width and a narrow area second opening of a second width less than the first width, by a lithographic process and by etching, so as to define a wide area and a narrow area on the silicon substrate;

(2) performing a thermal oxidation process so as to grow a first field oxide layer on the wide area and a second field oxide layer on the narrow area;

(3) depositing a polysilicon layer on the nitride layer and the first field oxide layer and the second field oxide layer, such that the polysilicon layer extends above a plane coincident with a topmost surface of the nitride layer;

(4) performing a chemical-mechanical polish (CMP) process so as to rub away the part of the polysilicon layer that lies above the plane coincident with the topmost surface of the nitride layer, said topmost surface acting as a stopper to the CMP process, to leave a first polysilicon layer covering the entire first field oxide layer and a second polysilicon layer covering the entire second field oxide layer, the first polysilicon layer being thinner than the second polysilicon layer; and (5) performing a thermal oxidation process so as to oxidize the first polysilicon layer and the second polysilicon layer to increase the thickness of the first field oxide layer and the second field oxide layer.

2. A process as claimed in claim 1, wherein in (1), the ratio of the thickness of the nitride layer to the thickness of the pad oxide is in the range from about 8 to about 10.

3. A process as claimed in claim 1, wherein in (1), the total thickness of the pad oxide plus the nitride layer is equal to about 0.4 to 0.6 times the respective thickness of the first field oxide layer and the second field oxide layer formed in (2).

4. A process as claimed in claim 1, wherein in (2), growing first and second field oxide layers includes performing a thermal oxidation process at a temperature of about 950° C. to 1,050° C. such that the first field oxide layer and the second field oxide layer are each grown to a respective thickness of about 3,500 Å to 4,500 Å.

5. A process as claimed in claim 1, wherein in (3), the polysilicon layer is formed by an LPCVD method to a thickness of about 2,000 Å to 3,000 Å.

6. A process as claimed in claim 1, wherein in (5), oxidizing the first and second polysilicon layers includes performing a thermal oxidation process at a temperature of about 950° C. to 1,050° C.

7. A process as claimed in claim 1, further comprising:
performing an isotropic etching process on the first field oxide layer and the second field oxide layer, using hydrofluoric acid, and;
then etching away the nitride layer and the pad oxide using $H_3PO_4$ and hydrofluoric acid.

8. A process as claimed in claim 7, further comprising:
forming a sacrificial oxide layer over the first field oxide layer and the second field oxide layer, and;
then using hydrofluoric acid to etch the sacrificial oxide layer, the first field oxide layer, and the second field oxide layer.

9. A process for forming at least a first field oxide layer and a second field oxide layer of different widths with approximately equal thickness, comprising:
(1) providing a silicon substrate on which a layer of pad oxide and a layer of nitride are successively formed and then forming through the nitride layer a wide area first opening of a first width and a narrow area second opening of a second width less than the first width, so as to define a wide area and a narrow area on the silicon substrate;
(2) performing a thermal oxidation process so as to grow a first field oxide layer on the wide area and a second field oxide layer on the narrow area;
(3) depositing a polysilicon layer on the nitride layer, the first field oxide layer and the second field oxide layer;
(4) rubbing away part of the polysilicon layer that lies above a plane coincident with the topmost surface of the nitride layer to leave a first polysilicon layer covering the entire first field oxide layer and a second polysilicon layer covering the entire second field oxide layer, the first polysilicon layer being thinner than the second polysilicon layer; and
(5) performing a thermal oxidation process so as to oxidize the first polysilicon layer and the second polysilicon layer to increase the thickness of the first field oxide layer and the second field oxide layer.

10. A process as claimed in claim 9, further comprising:
performing an isotropic etching process on the first field oxide layer and the second field oxide layer, using hydrofluoric acid, and;
then etching away the nitride layer and the pad oxide using $H_3PO_4$ and hydrofluoric acid.

11. A process as claimed in claim 10, further comprising:
forming a sacrificial oxide layer on the first field oxide layer and the second field oxide layer, and;
then using hydrofluoric acid to etch the sacrificial oxide layer, the first field oxide layer, and the second field oxide layer.

12. A process for forming a field oxide layer of predetermined width, comprising:
(1) providing a silicon substrate on which a layer of pad oxide and a layer of nitride are successively formed and then forming through the nitride layer a first opening of a first width and a second opening of a second width less than the first width, so as to define a respective wide area and a narrow area on the silicon substrate;
(2) growing a first field oxide layer on the wide area, and a second field oxide layer on the narrow area;
(3) depositing a polysilicon layer on the nitride layer and the first and second field oxide layers;
(4) rubbing away part of the polysilicon layer that lies above a plane coincident with the topmost surface of the nitride layer to leave a reduced thickness polysilicon layer completely covering the first and second field oxide layers; and
(5) oxidizing the reduced polysilicon layer to increase the thickness of the first and second field oxide layers.

13. A process as claimed in claim 12, wherein the reduced polysilicon layer is a first and second polysilicon layer, the first polysilicon layer being thinner than the second polysilicon layer; and
wherein (5) includes oxidizing the first and second polysilicon layers to increase the thicknesses of the first and second field oxide layers, such that the thicknesses of the first and second field oxide layers become approximately equal.

14. A method as claimed in claim 12, wherein the openings are formed in (1) by a lithographic process and by etching, wherein the field oxide layers are grown in (2) by thermal oxidation and wherein the reduced polysilicon layer is oxidized in (5) by thermal oxidation.

* * * * *